(12) United States Patent
Ryan et al.

(10) Patent No.: US 8,431,482 B1
(45) Date of Patent: Apr. 30, 2013

(54) INTEGRATED CIRCUITS AND METHODS FOR PROCESSING INTEGRATED CIRCUITS WITH EMBEDDED FEATURES

(75) Inventors: Errol T. Ryan, Clifton Park, NY (US); Xunyuan Zhang, Troy, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/362,981

(22) Filed: Jan. 31, 2012

(51) Int. Cl.
*H01L 21/4763* (2006.01)

(52) U.S. Cl.
USPC ........... 438/640; 438/622; 438/643; 438/653; 438/664; 438/669; 257/750; 257/751; 257/773; 257/774; 257/E21.582

(58) Field of Classification Search .................. None
See application file for complete search history.

(56) References Cited

U.S. PATENT DOCUMENTS

| | | | |
|---|---|---|---|
| 6,261,953 B1 * | 7/2001 | Uozumi | 438/687 |
| 2008/0171447 A1 | 7/2008 | Wallow et al. | |
| 2009/0023298 A1 | 1/2009 | Deng et al. | |

OTHER PUBLICATIONS

Lu et al., "Reproductible Resistive-Switching Behavior in Copper-Nitride Thin Film Prepared by Plasma-Immersion Ion Implantation," Phys. Status Solidi A 208, No. 4, pp. 874-877, (2011).
Nosaka et al., "Thermal Decomposition of Copper Nitride Thin Films and Dots Formation by Electron Beam Writing," Applied Surface Science, 169-170, pp. 358-361, (2001).

* cited by examiner

*Primary Examiner* — Kyoung Lee
(74) *Attorney, Agent, or Firm* — Ingrassia Fisher & Lorenz, P.C.

(57) ABSTRACT

Integrated circuits, a process for recessing an embedded copper feature within a substrate, and a process for recessing an embedded copper interconnect within an interlayer dielectric substrate of an integrated circuit are provided. In an embodiment, a process for recessing an embedded copper feature, such as an embedded copper interconnect, within a substrate, such as an interlayer dielectric substrate, includes providing a substrate having an embedded copper feature disposed therein. The embedded copper feature has an exposed surface and the substrate has a substrate surface adjacent to the exposed surface of the embedded copper feature. The exposed surface of the embedded copper feature is nitrided to form a layer of copper nitride in the embedded copper feature. Copper nitride is selectively etched from the embedded copper feature to recess the embedded copper feature within the substrate.

18 Claims, 4 Drawing Sheets

INTEGRATED CIRCUITS AND METHODS FOR PROCESSING INTEGRATED CIRCUITS WITH EMBEDDED FEATURES

TECHNICAL FIELD

The present invention generally relates to integrated circuits, processes for recessing an embedded copper feature within a substrate, and processes for recessing an embedded copper interconnect within an interlayer dielectric substrate of an integrated circuit. More particularly, the present invention relates to integrated circuits having an embedded copper interconnect recessed within an interlayer dielectric substrate thereof with the embedded copper interconnect having a recessed surface of maximized evenness, and processes for recessing embedded copper features within substrates that promote formation of topography of maximized evenness in the recessed surface of the embedded copper features.

BACKGROUND

Embedded copper features within dielectric substrates find widespread use for various electronic applications. For example, integrated circuits of microprocessors generally include numerous levels of interconnect routing in the form of copper interconnects, such as lines and dots, embedded within a dielectric substrate to connect transistors within the integrated circuits. Each level of interconnect routing is separated from immediately adjacent levels by the dielectric material, referred to in the art as an interlayer dielectric (ILD). Adjacent levels of interconnect routing may be embedded in distinct layers of ILD, and with the interconnect routing configured in such a way so as to ensure that dielectric material separates the adjacent interconnect routings. In this regard, the embedded copper interconnects in the interconnect routing can be selectively insulated from both other embedded copper interconnects in the same interconnect routing and from embedded copper interconnects in interconnect routing of adjacent levels. Likewise, embedded copper interconnects in adjacent levels of interconnect routing can also be selectively connected to fabricate desired circuitry in the integrated circuits.

With advances in integrated circuits, driven by a desire to shrink sizes, aspect ratios of height to width of the embedded copper interconnects in the interconnect routing have been maximized to enable spacing between the embedded copper interconnects to be minimized. However, the minimized spacing between the embedded copper interconnects gives rise to device reliability concerns that are attributable to various phenomena. One particular phenomena that gives rise to reliability concerns is time dependent dielectric breakdown (TDDB), which results from migration of copper ions from the embedded copper interconnects into an interface between adjacent levels of the interconnect routing. TDDB is often exacerbated with decreased spacing between embedded copper interconnects in the interconnect routings. To combat TDDB, efforts have been made to recess the embedded copper interconnects within the ILD, thereby offsetting surfaces of the embedded copper interconnects from a plane of the interface between the adjacent levels and effectively forming a barrier to flow of copper ions into the interface. In particular, during formation of the levels of interconnect routing, a layer of ILD may be formed upon a substrate, which may be a semiconductor substrate or another level of interconnect routing. Trenches and/or vias may be etched into the ILD, followed by deposition of copper into the trenches and/or vias. Excess copper may be removed through chemical and/or mechanical removal techniques to define the interconnect routing of embedded copper interconnects. Wet etch techniques are then employed to etch copper from the exposed surfaces of the embedded copper interconnects to thereby recess the embedded copper interconnects within the ILD prior to forming additional layers thereon.

Unfortunately, existing processes for recessing embedded copper interconnects within ILD also give rise to reliability concerns. In particular, wet etch techniques for etching copper from the exposed surfaces of the embedded copper interconnects result in an uneven topography in the recessed surfaces of the embedded copper interconnects and impacts formation of additional layers upon the embedded copper interconnects after recessing. Plasma-enhanced chemical vapor deposition (PECVD) is often used to form the additional layers over the embedded copper interconnects after recessing. Because layers formed through PECVD are generally not highly conformal, gaps may be formed between the recessed surfaces of the embedded copper interconnects and the additional layers formed thereon through PECVD, due to the uneven topography in the recessed surfaces of the embedded copper interconnects. The presence of such gaps between the recessed surfaces of the embedded copper interconnects and the additional layers formed thereon may give rise to device reliability concerns. Gap formation may even be a concern if a highly conformal layer is formed over the embedded copper interconnects after recessing due to the uneven topography in the recessed surfaces of the embedded copper interconnects after recessing.

Accordingly, there is a need to provide processes for recessing copper features within a substrate that promote formation of topography of maximized evenness in the recessed surface of the embedded copper features. In particular, there is a need to provide processes for recessing an embedded copper interconnect within an interlayer dielectric substrate in an integrated circuit, with the embedded copper interconnect having a recessed surface of maximized evenness. There is also a need to provide integrated circuits having an interlayer dielectric substrate with an embedded copper interconnect recessed therein and having a recessed surface, and with the recessed surface of the embedded copper interconnect having topography of maximized evenness.

BRIEF SUMMARY

Integrated circuits, a process for recessing an embedded copper feature within a substrate, and a process for recessing an embedded copper interconnect within an interlayer dielectric substrate of an integrated circuit are provided. In an embodiment, a process for recessing an embedded copper feature within a substrate includes providing a substrate having an embedded copper feature disposed therein. The embedded copper feature has an exposed surface and the substrate has a substrate surface adjacent to the exposed surface of the embedded copper feature. The exposed surface of the embedded copper feature is nitrided to form a layer of copper nitride in the embedded copper feature. Copper nitride is selectively etched from the embedded copper feature to recess the embedded copper feature within the substrate.

In another embodiment, a process for recessing an embedded copper interconnect within an interlayer dielectric substrate of an integrated circuit includes providing an interlayer dielectric substrate having an embedded copper interconnect disposed therein. The embedded copper interconnect has an exposed surface and the interlayer dielectric substrate has a substrate surface adjacent to the exposed surface of the embedded copper interconnect. The exposed surface of the embedded copper interconnect is nitrided to form a layer of copper nitride in the embedded copper interconnect. Copper nitride is selectively etched from the embedded copper interconnect to recess the embedded copper interconnect within the substrate.

In another embodiment, an integrated circuit includes a semiconductor substrate and an interlayer dielectric substrate disposed on the semiconductor substrate. The interlayer dielectric substrate has an embedded copper interconnect disposed therein. The embedded copper interconnect is recessed in the interlayer dielectric substrate and defines a recessed surface. The recessed surface of the embedded copper interconnect has an average surface roughness $R_a$ of less than or equal to about 20 nm.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Processes for recessing an embedded copper feature within a substrate, such as processes for recessing an embedded copper interconnect within an interlayer dielectric substrate of an integrated circuit, and integrated circuits are provided herein. The processes enable formation of topography of maximized evenness in the recessed surface of the embedded copper features by nitriding an exposed surface of the embedded copper feature to form a layer of copper nitride and selectively etching the layer of copper nitride from the embedded copper feature. Because etchants may be employed that preferentially etch copper nitride over copper, with significantly accelerated etch rates realized for copper nitride over copper, a uniform layer of copper nitride can be formed on the embedded copper feature and then selectively removed with minimal impact on the underlying copper remaining in the embedded copper feature, resulting in maximized evenness in the recessed surface of the embedded copper feature. As a result, integrated circuits may be produced that include an interlayer dielectric substrate having an embedded copper interconnect recessed therein, with a recessed surface of the embedded copper interconnect having minimal surface roughness. However, the processes for recessing the embedded copper feature within the substrate can be employed for various applications where there is a desire to recess the embedded copper feature within the substrate and where surface roughness of the recessed surface of the embedded copper feature is a concern. Thus, while the processes described herein are most beneficial for recessing embedded copper interconnects within interlayer dielectric substrate of integrated circuits, the processes described herein are not to be construed as limited to such applications.

Figure 1:
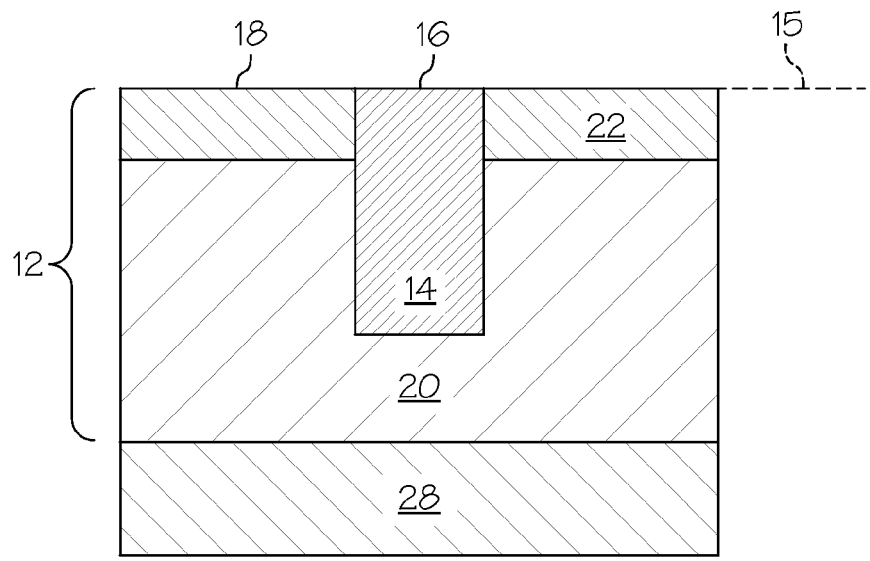
FIG. 1 is a schematic cross-sectional side view of an initially-provided substrate including an embedded copper feature disposed therein in accordance with an embodiment of a process of the instant invention.

In an embodiment of a process for recessing an embedded copper feature within a substrate, as schematically shown in cross-section in FIG. 1, the process includes providing a substrate 12 that has an embedded copper feature 14 disposed therein. The substrate 12 may be a dielectric substrate 12 that includes a material having dielectric properties such as, but not limited to, glass, ceramic, or polymer. However, it is to be appreciated that the substrate 12 may include any material in which copper can be embedded and which is resistant to etching techniques that remove copper nitride, as explained in further detail below. Depending upon the particular application, low k or ultra-low k dielectric materials may be included in the dielectric substrate 12. Such low k or ultra-low k dielectric materials are known in the art and are particularly useful when the instant process is utilized to form integrated circuits (shown at numeral 10 in FIG. 8). The embedded copper feature 14 may include substantially pure copper (e.g., at least about 99% pure) and is typically electronics grade copper that is suitable for sensitive circuitry of integrated circuits. In an embodiment, the embedded copper feature 14 is further defined as a copper interconnect, which may be in the form of one or more dots and/or lines, and the provided substrate 12 may be more specifically defined as an interlayer dielectric substrate 12 having an embedded copper interconnect 14 disposed therein.

In the substrate 12 that is initially provided, as shown in FIG. 1, the embedded copper feature 14 has an exposed surface 16 and the substrate 12 also has a substrate surface 18 that is disposed adjacent to the exposed surface 16 of the embedded copper feature 14. By "exposed surface", it is meant that the subject surface 16 of the embedded copper feature 14 is free from overlaying layers that would prevent access to the exposed surface 16 for later treatment steps. As described in further detail below, the exposed surface 16 of the embedded copper feature 14 is subject to nitriding in later steps. In this regard, the exposed surface 16 of the embedded copper feature 14 may be subject to processing if desired, such as for removal of oxides or portions of overlaying layers, in preparation for nitriding. However, it is to be appreciated that no processing of the embedded copper feature 14 may be necessary prior to nitriding so long as the embedded copper feature 14 has the exposed surface 16 that is available for nitriding. In an embodiment, the exposed surface 16 of the embedded copper feature 14 that is subject to nitriding and the adjacent substrate surface 18 are disposed along a common plane 15 in the substrate 12 that is initially provided. Alternatively, although not shown, the exposed surface 16 of the embedded copper feature 14 that is subject to nitriding and the adjacent substrate surface 18 may be disposed along offsetting planes so long as the exposed surface 16 of the embedded copper feature 14 is available for nitriding. Further, although again not shown, within a particular substrate, a plurality of embedded copper features 14 may be present that have exposed surfaces 16 on different planes. It is to be appreciated that, in any of the aforementioned embodiments, select exposed surfaces 16 of some of the embedded copper features 14 can be nitrided while leaving other embedded copper features 14 in the substrate 12 unaltered, thereby providing a mechanism for selectively recessing some embedded copper features 14 but not others through the techniques that are described in further detail below.

Figure 5:
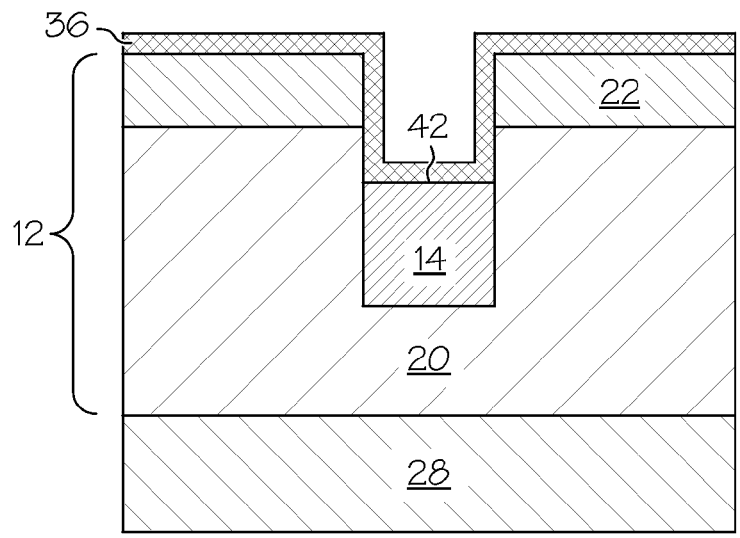
FIG. 5 is a schematic cross-sectional side view of substrate of FIG. 4 with a capping layer formed over the substrate and embedded copper feature after recessing.
Figure 6:
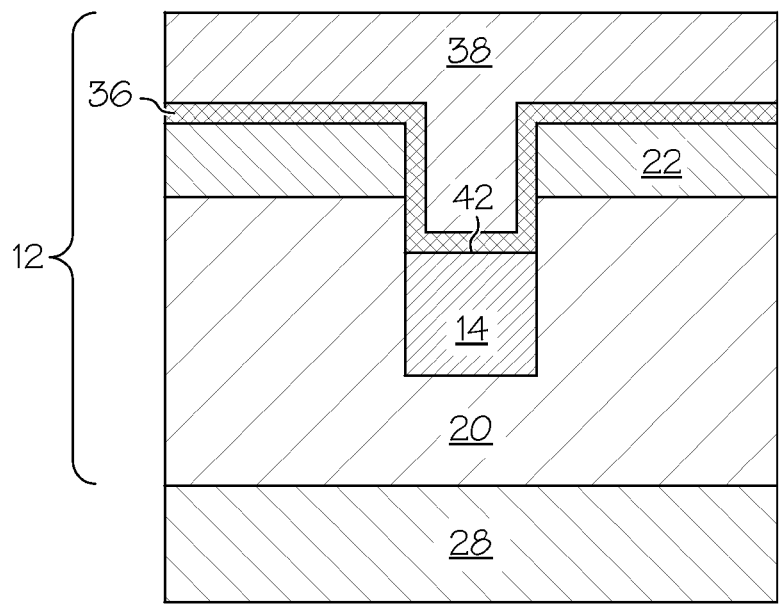
FIG. 6 is a schematic cross-sectional side view of substrate of FIG. 5 with a NBLoK layer formed over the capping layer.

In an embodiment, the substrate 12 that is initially provided includes a single layer of dielectric material with the embedded copper feature 14 disposed therein. Alternatively, in another embodiment as shown in FIG. 1, the substrate 12 that is initially provided includes a plurality of individual layers 20, 22 that are dielectric in nature and that, together, form the substrate 12 with the embedded copper feature 14 disposed in the substrate 12. For example, the substrate 12 may initially include a low k or ultra-low k layer 20 and a tetraethylorthosilicate (TEOS) layer 22 disposed thereon. By "embedded", it is meant that the embedded copper feature 14 at least partially extends into one or more layers 20, 22 of the substrate 12 and may extend completely through the substrate 12, from one side to the other. When the substrate 12 includes the plurality of individual layers 20, 22, the embedded copper feature 14 at least partially extends into at least one of the layers 20, 22. As shown in FIGS. 5 and 6, it is to be appreciated that additional layers 36, 38 of dielectric material may be formed in the substrate 12 in further steps after recessing the embedded copper feature 14 within the substrate 12. The additional layers 36, 38 that are formed in the substrate 12 in further steps may also be characterized as part of the substrate 12 so long as such layers 36, 38 are dielectric in nature. In any event, the substrate 12 is initially provided with the embedded copper feature 14 disposed therein and with the embedded copper feature 14 having the exposed surface 16. Additionally, because contour of the exposed surface 16 of the embedded copper feature 14 may influence even recessing of the embedded copper feature 14, the exposed surface 16 of the embedded copper feature 14 may have a low average surface roughness, such as less than or equal to about 20 nm, less than or equal to about 5 nm, or from about 0.1 to about 5 nm.

In accordance with the instant process and, in particular, with the step of providing the substrate 12 having the embedded copper feature 14 disposed therein, the substrate 12 may be obtained from a supplier with the embedded copper feature 14 already disposed therein. Alternatively, the substrate 12 may be prepared in accordance with the instant process. For example, the substrate 12 may be formed through conventional processes of forming dielectric layers such as, for example, spin-coating dielectric material onto a base substrate 28, such as a semiconductor wafer or an underlying dielectric substrate, to form a layer 20 of dielectric material, e.g., a low k or ultra-low k layer 20. An additional layer 22, such as a TEOS layer 22, may then be formed over the low k or ultra-low k layer 20, such as through chemical vapor deposition (CVD), to form the substrate 12. A trench and/or via (not shown) may be etched into the substrate 12, followed by filling the trench and/or via with copper to form the embedded copper feature 14, e.g., the copper interconnect 14. Excess copper may be removed through chemical and mechanical planarization (CMP) techniques to provide a generally planar exposed surface of the embedded copper feature 14, along common plane with the adjacent substrate surface 18. Additional layers 36, 38 of the dielectric material may be similarly formed in the substrate 12, in stacked fashion, after embedding the copper feature 14. Appropriate etch techniques are performed on any overlaying substrate layers, if necessary, to provide the embedded copper feature 14 with the exposed surface 16 in anticipation of recessing the embedded copper feature 14.

Figure 2:
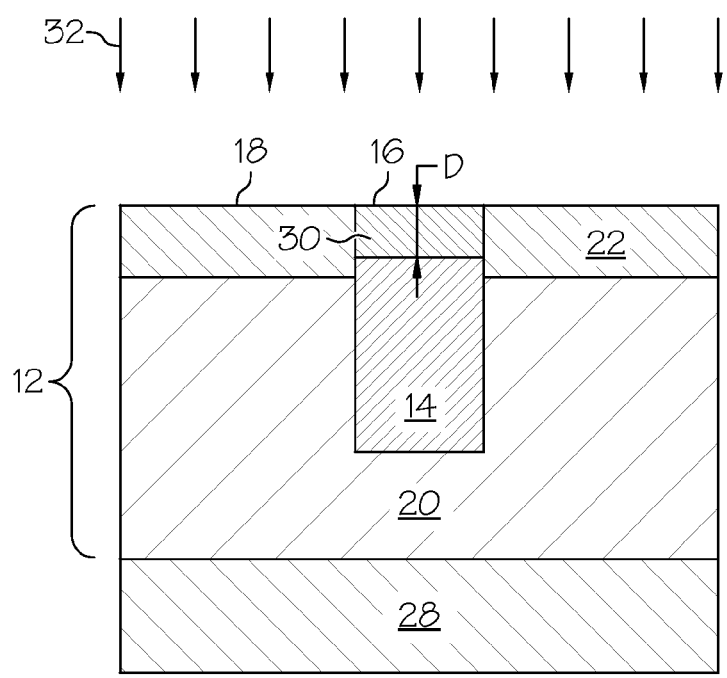
FIG. 2 is a schematic cross-sectional side view of substrate of FIG. 1 being subject to nitriding to form a layer of copper nitride in the embedded copper feature.
Figure 8:
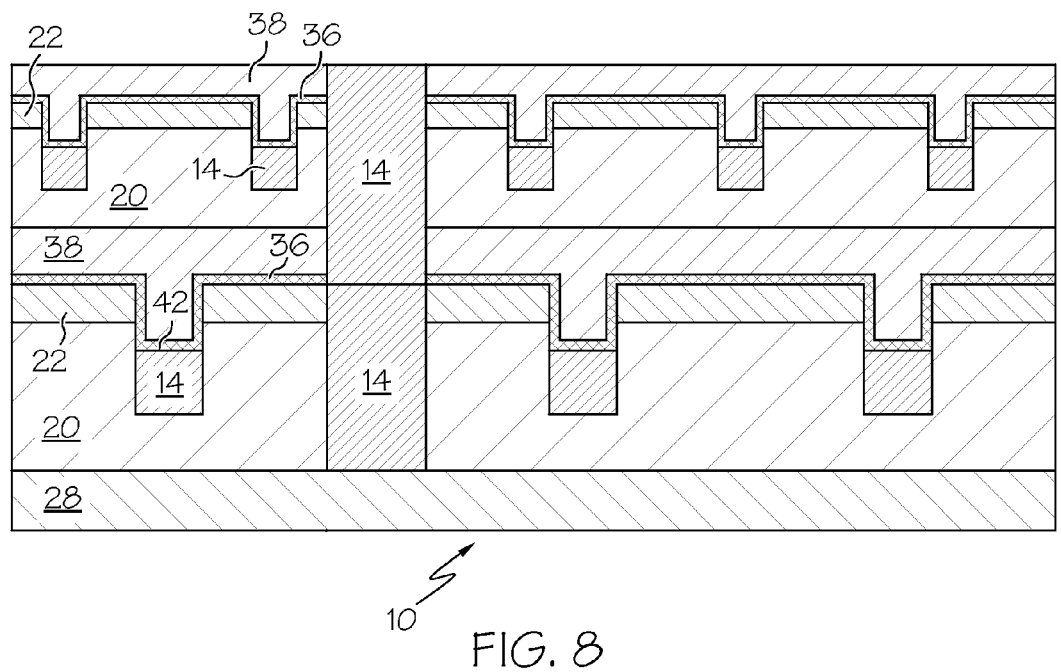
FIG. 8 is a schematic cross-sectional side view of a portion of an integrated circuit including an interlayer dielectric substrate and embedded copper interconnects recessed therein in accordance with another embodiment.

As alluded to above, and as shown in cross-section in FIG. 2, the exposed surface 16 of the embedded copper feature 14 is nitrided to form a layer of copper nitride 30, $C_3N$, in the embedded copper feature 14. In the embodiment in which the embedded copper feature 14 is an embedded copper interconnect 14 within an interlayer dielectric substrate 12 of an integrated circuit 10, the exposed surface 16 of the embedded copper interconnect 14 is nitrided to form a layer of copper nitride 30 in the embedded copper interconnect 14. The step of nitriding the exposed surface 16 of the embedded copper feature 14 includes forming the layer of copper nitride 30 from copper that is already present in the embedded copper feature 14, rather than depositing a separate layer of copper nitride over the embedded copper feature 14. Nitriding the exposed surface 16 of the embedded copper feature 14 facilitates recessing the embedded copper feature 14 within the substrate 12 by subsequently removing the formed layer of copper nitride 30, as explained in further detail below. As also alluded to above, the substrate 12 may be provided with a plurality of embedded copper features 14 that have exposed surfaces 16 on the same or different planes, and select exposed surfaces 16 of some of the embedded copper features 14 can be nitrided while leaving other embedded copper features 14 in the substrate 12 unaltered, thereby providing a mechanism for selectively recessing some embedded copper features 14 but not others (as shown in FIG. 8) for purposes of fabricating complex configurations of embedded copper features 14 in the substrate 12.

The exposed surface 16 of the embedded copper feature 14 may be nitrided through processes that enable substantially uniform formation of the layer of copper nitride 30 in the embedded copper feature 14. In an embodiment, nitriding is further defined as implanting nitrogen ions 32 into the embedded copper feature 14, e.g., the embedded copper interconnect 14, through the exposed surface 16 of the embedded copper feature 14. A variety of ion implantation techniques are known that are capable of implanting nitrogen ions 32 into copper to form copper nitride. In an embodiment, the nitrogen ions 32 are implanted into the embedded copper feature 14 through a gas cluster ion beam (GCIB) technique to form the layer of copper nitride 30, in which the exposed surface 16 of the embedded copper feature 14, as well as the substrate surface 18, is bombarded by a beam of high energy nanoscale cluster ions. For example, the ions can be nitrogen-containing ions 32 such as ammonia. GCIB techniques are generally known in the art. In this embodiment, the beam of nitrogen ions 32 can be directed onto the exposed surface 16 of the copper interconnect 14 and the substrate surface 18 to form copper nitride in the embedded copper feature 14 in a highly-controlled manner, thereby achieving a substantially uniform depth of the layer of copper nitride 30 in the embedded copper interconnect 14. In another embodiment, the nitrogen ions 32 are implanted into the embedded copper feature 14 through a plasma-immersion ion implantation (PIII) technique to form the layer of copper nitride 30, which can also be highly-controlled to achieve a substantially uniform depth of the layer of copper nitride 30 in the embedded copper interconnect 14. PIII techniques are also generally known in the art.

By nitriding the exposed surface of the embedded copper interconnect 14, such as with the GCIB or PIII techniques, the layer of copper nitride 30 can be formed having substantially uniform thickness, with the layer of copper nitride 30 being distinct from the elemental copper that underlies the layer of copper nitride 30. The layer of copper nitride 30 includes sufficient amounts of copper nitride to enable selective etching of the layer of copper nitride 30 from the embedded copper feature, as described in further detail below. In an embodiment, the layer of copper nitride 30 includes copper nitride with an atomic ratio of copper to nitrogen of about 3:1, and may be substantially pure.

Figure 3:
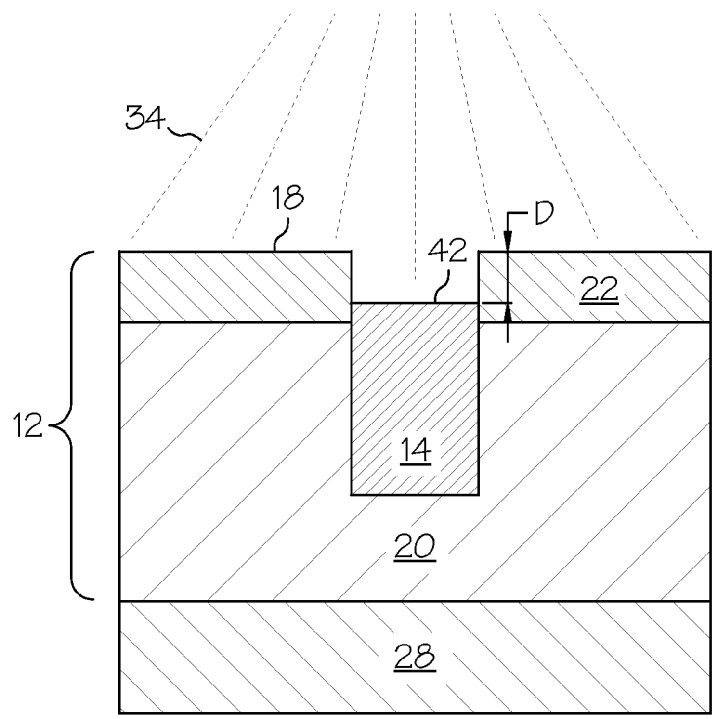
FIG. 3 is a schematic cross-sectional side view of substrate of FIG. 2 with the layer of copper nitride being selectively etched with an etchant.

After nitriding the exposed surface 16 of the embedded copper feature 14, e.g., the embedded copper interconnect 14, and as shown in cross-section in FIG. 3, the copper nitride is selectively etched from the embedded copper feature 14 to recess the embedded copper feature 14 within the substrate 12. Selective etching of the copper nitride generally involves exposing the substrate 12 and layer of copper nitride 30 to an etchant 34 that etches copper nitride at a higher rate as compared to an etch rate of elemental copper in the etchant 34. The substrate 12 is preferably resistant to etching by the etchant 34. One example of a suitable etchant 34 that etches copper nitride at a higher rate than elemental copper is hydrochloric acid, with the concentration of hydrochloric acid in solution controlled to either hasten or slow etching of the copper nitride. In a specific embodiment, the etchant 34 is a hydrochloric acid solution having a concentration of at least about 10 grams/liter $H_2O$ (g/l), such as from about 30 to about 200 g/l or from 50 to about 100 g/l. Table I below provides etch rates of elemental copper and copper nitride at room temperature as a function of hydrochloric acid concentration in water.

TABLE I

| HCl Conc. (g/l) | Cu Etch Rate (nm/min) | $Cu_3N$ Etch Rate (nm/min) |
|---|---|---|
| 10 | 3 | 836 |
| 30 | 4 | 1064 |
| 50 | ~0 | 1560 |
| 100 | ~0 | 3900 |

Selective etching of the layer of copper nitride 30 from the embedded copper feature 14 is typically controlled based upon an actual or calculated theoretical thickness of the layer of copper nitride 30 and known etch rates of copper nitride when exposed to various etchants 34, such as the hydrochloric acid solution, with selective etching conducted to theoretically remove the layer of copper nitride 30 based upon the aforementioned variables. In an embodiment, the entire layer of copper nitride 30 is selectively etched from the embedded copper feature 14, thereby recessing the embedded copper feature 14 within the substrate 12. In another embodiment, a portion of the layer of copper nitride 30 may remain in the embedded copper feature 14 after recessing. In any event, it is to be appreciated that trace copper nitride may remain in the embedded copper feature 14 after selectively etching the layer of copper nitride 30 from the embedded copper feature 14. As such, the entire layer of copper nitride 30 may be etched from the embedded copper feature 14, but the instant invention is not limited to complete etching of the entire layer of copper nitride 30.

Figure 4:
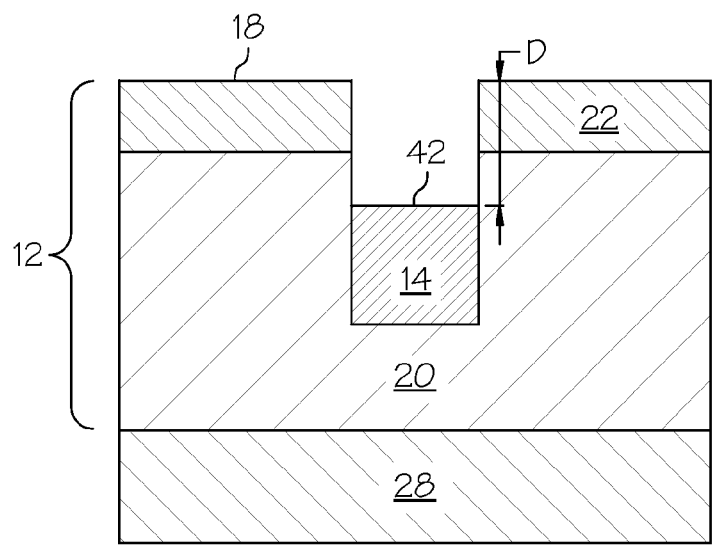
FIG. 4 is a schematic cross-sectional side view of substrate of FIG. 3 showing recessing of the embedded copper feature after repeated steps of nitrating the exposed surface of the embedded copper feature and selectively etching the layer of copper nitride from the embedded copper feature.

The steps of nitriding the exposed surface 16 of the embedded copper feature 14 to form the layer of copper nitride 30 and selectively etching the layer of copper nitride 30 can be utilized to recess the embedded copper feature 14 to various depths within the substrate 12. In an embodiment, the exposed surface 16 of the embedded copper feature 14, e.g., the embedded copper interconnect 14, is nitrided to a recess depth D within the embedded copper feature 14, and the embedded copper feature 14 is selectively etched to the recess depth D, thereby effectively recessing the embedded copper feature 14 within the substrate 12. Because there are limits to the depths to which the embedded copper feature 14 can be effectively nitrided, the steps of nitriding the exposed surface 16 of the embedded copper feature 14 (shown in FIG. 3) and selectively etching the layer of copper nitride 30 from the embedded copper feature 14 (shown in FIG. 4) may be repeated to further recess the embedded copper feature 14 within the substrate 12 when recess depths D are desired that may not be possible with a single cycle of nitriding and selectively etching the layer of copper nitride 30. FIG. 4 shows a substrate 12 having an embedded copper features 14 disposed therein that has been recessed through repeated steps of nitriding and selective etching. Although recess depth D is highly dependent upon design considerations, the embedded copper feature 14 may be recessed to a depth of at least about 5 nm, such as from about 5 to about 2000 nm, from about 50 to about 500 nm, or from about 50 to about 300 nm.

Due to the steps of nitriding the exposed surface 16 of the embedded copper feature 14 and selectively etching the layer of copper nitride 30, the embedded copper feature 14 defines a recessed surface 42 of maximized evenness. In an embodiment, the recessed surface 42 of the embedded copper interconnect 14, after nitriding and selectively etching, has an average surface roughness $R_a$ of less than or equal to about 20 nm, such as less than or equal to about 5 nm, or from about 0.1 to about 5 nm.

As alluded to above, the substrate 12 may include a plurality of embedded copper features 14 disposed therein, and select exposed surfaces 16 of some of the embedded copper features 14 can be nitrided while leaving other embedded copper features 14 in the substrate 12 unaltered. By only nitriding some of the embedded copper features 14 while leaving other embedded copper features 14 unaltered, the configuration of lines and/or dots of the embedded copper features 14 can be manipulated depending upon the interactions desired between specific embedded copper features 14 within a particular substrate 12 or between substrates 12, 40. For example, as shown in FIG. 8, for embedded copper features that are intended to provide electrical connections between various layers of substrates, there may be a desire to leave such embedded copper features unaltered while only recessing embedded copper features that are to be insulated from embedded copper features in other substrates.

Figure 7:
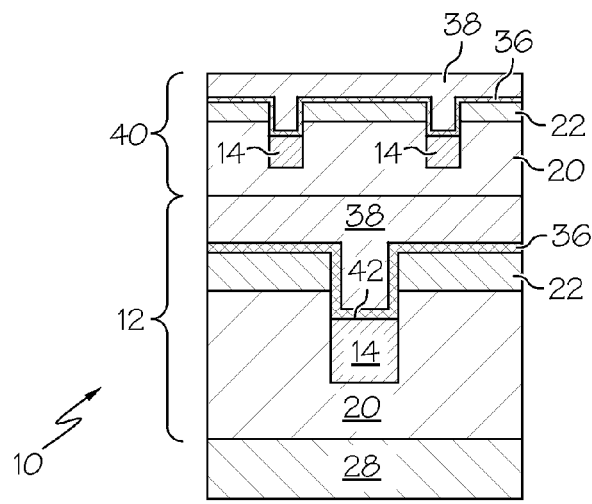
FIG. 7 is a schematic cross-sectional side view of substrate of FIG. 6 with an additional overlaying substrate formed on the NBLoK layer, and with the additional overlaying substrate including embedded copper features disposed therein.

Once the embedded copper feature 14 is recessed within the substrate 12 to the desired recess depth D, and as shown in cross-section in FIGS. 5 and 6, additional layers 36, 38 may be deposited over the embedded copper feature 14, existing substrate layers 20, 22, and other features in accordance with fabrication techniques known in the art. For example, in an embodiment and as shown in FIG. 5, a capping layer 36 is formed over the embedded copper feature 14 after recessing the embedded copper feature 14. The capping layer 36 is typically formed from a dielectric material and serves to passivate the embedded copper features 14 within the substrate 12. In an embodiment, when the embedded copper feature 14 is a copper interconnect 14 and the substrate 12 is an interlayer dielectric substrate 12 of an integrated circuit 10, the capping layer 36 may include a silicon-based dielectric material such as silicon nitride, which may be formed through various techniques that are known in the art such as plasma-enhanced chemical vapor deposition. In an embodiment, the capping layer 36 includes a layer of silicon nitride 36 that is formed directly over the existing layers 20, 22 of the substrate 12 and the embedded copper interconnect 14, followed by formation of a $SiN_xC_yH_z$ layer 38 (referred to in the art as NBLoK; shown in FIG. 6). As shown in FIG. 6, the capping layer 36 and the NBLoK layer 38 that are formed over the embedded copper interconnect 14 may be considered part of the interlayer dielectric substrate 12 as the capping layer 36 may serve to electrically isolate the embedded copper interconnect 14 from other embedded copper interconnects 14 that may subsequently be formed in additional overlaying substrates 40, and the NBLoK layer 38 may serve to provide further dielectric insulation between the embedded copper interconnect 14 and the additional overlaying substrate 40 as well as to provide etch-stop functions during formation of vias in the additional overlaying substrate 40. Alternatively, the capping layer 36 and NBLoK layer 38 may perform other functions as may be desirable in accordance with design considerations. In an embodiment, such as for an integrated circuit 10 and as shown in cross-section in FIG. 7 (which may represent a portion of an integrated circuit 10), additional overlaying substrates 40 having an embedded copper feature 14 may be formed on the capping layer 36 (more specifically, directly over the NBLoK layer 38), as is common in integrated circuits 10.

As set forth above, and as partially shown in FIG. 8, an integrated circuit 10 is provided in accordance with the instant invention. The integrated circuit 10 includes a semiconductor substrate 28 and an interlayer dielectric substrate 12 disposed on the semiconductor substrate 28. The interlayer dielectric substrate 12 has an embedded copper interconnect 14 disposed therein. The embedded copper interconnect 14 is recessed in the interlayer dielectric substrate 12 and defines a recessed surface 42. The recessed surface 42 of the embedded copper interconnect 14 has an average surface roughness $R_a$ of less than or equal to about 20 nm, such as less than or equal to about 5 nm or from about 0.1 to about 5 nm. The integrated circuit 10 may include a capping layer 36 disposed over the embedded copper interconnect 14 and in contact with the recessed surface 42 of the embedded copper interconnect 14. Another interlayer dielectric substrate 40 having an embedded copper interconnect 14 disposed therein may be disposed on the capping layer 36. With the embedded copper interconnect 14 having the recessed surface 42 with such low average surface roughness $R_a$, as set forth above, gaps between the recessed surface 42 of the embedded copper interconnect 14 and the capping layer 36 are minimized, leading to greater device robustness and less incidence of failure due to the presence of such gaps. While the integrated circuit 10 can be prepared in accordance with the processes described herein, the integrated circuits 10 are not so limited and can be prepared in accordance with other processes so long as the above-described surface roughness of the recessed surface 42 in the embedded copper interconnect 14 is achieved.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A process for recessing an embedded copper feature within a substrate, the process comprising:
   providing a substrate having an embedded copper feature disposed therein, the embedded copper feature having an exposed surface and the substrate having a substrate surface adjacent to the exposed surface of the embedded copper feature;
   nitriding the exposed surface of the embedded copper feature to form a layer of copper nitride in the embedded copper feature;
   selectively etching the layer of copper nitride from the embedded copper feature to recess the embedded copper feature within the substrate.

2. The process of claim 1, wherein the exposed surface of the embedded copper feature is nitrided to a recess depth within the embedded copper feature and wherein the embedded copper feature is selectively etched to the recess depth.

3. The process of claim 2, wherein nitriding the exposed surface of the embedded copper feature and selectively etching the layer of copper nitride from the embedded copper feature are repeated to further recess the embedded copper feature within the substrate.

4. The process of claim 1, wherein the exposed surface of the embedded copper feature subject to nitriding and the substrate surface adjacent the embedded copper feature are disposed along a common plane.

5. The process of claim 1, wherein the layer of copper nitride is selectively etched with a hydrochloric acid solution.

6. The process of claim 1, wherein nitriding is further defined as implanting nitrogen ions into the embedded copper feature through the exposed surface thereof.

7. The process of claim 1, wherein providing the substrate having the embedded copper feature embedded therein comprises etching a trench and/or via into the substrate and filling the trench and/or via with copper to form the embedded copper feature.

8. The process of claim 1, further comprising forming a capping layer over the embedded copper feature after recessing the embedded copper feature.

9. The process of claim 8, further comprising forming another substrate having an embedded copper feature over the capping layer.

10. A process for recessing an embedded copper interconnect within an interlayer dielectric substrate of an integrated circuit, the process comprising:
    providing an interlayer dielectric substrate having an embedded copper interconnect disposed therein, the embedded copper interconnect having an exposed surface and the interlayer dielectric substrate having a substrate surface adjacent to the exposed surface of the embedded copper interconnect;
    nitriding the exposed surface of the embedded copper interconnect to form a layer of copper nitride in the embedded copper interconnect;
    selectively etching the layer of copper nitride from the embedded copper interconnect to recess the embedded copper interconnect within the substrate.

11. The process of claim 10, wherein the exposed surface of the embedded copper interconnect is nitrided to a recess depth within the embedded copper interconnect and wherein the embedded copper interconnect is selectively etched to the recess depth.

12. The process of claim 11, wherein nitriding the exposed surface of the embedded copper feature and selectively etching the layer of copper nitride from the embedded copper feature are repeated to further recess the embedded copper feature within the substrate.

13. The process of claim 10, wherein the exposed surface of the embedded copper interconnect subject to nitriding and the interlayer dielectric substrate surface are disposed along a common plane.

14. The process of claim 10, wherein the layer of copper nitride is selectively etched with a hydrochloric acid solution.

15. The process of claim 10, wherein nitriding is further defined as implanting nitrogen ions into the embedded copper interconnect through the exposed surface thereof.

16. The process of claim 10, wherein providing the interlayer dielectric substrate having the embedded copper interconnect embedded therein comprises etching a trench and/or via into the interlayer dielectric substrate and filling the trench and/or via with copper to form the embedded copper interconnect.

17. The process of claim 10, further comprising forming a capping layer over the embedded copper interconnect after recessing the embedded copper interconnect.

18. The process of claim 17, further comprising forming another interlayer dielectric substrate having an embedded copper interconnect over the capping layer.

* * * * *